United States Patent
Yue et al.

(10) Patent No.: US 8,140,948 B2
(45) Date of Patent: Mar. 20, 2012

(54) EFFICIENT LOW COMPLEXITY HIGH THROUGHPUT LDPC DECODING METHOD AND OPTIMIZATION

(75) Inventors: Guosen Yue, Plainsboro, NJ (US); Xiaodong Wang, New York, NY (US); Mohammad Madihian, Plainsboro, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 1041 days.

(21) Appl. No.: 12/048,464

(22) Filed: Mar. 14, 2008

(65) Prior Publication Data

US 2009/0083609 A1 Mar. 26, 2009

Related U.S. Application Data

(60) Provisional application No. 60/974,512, filed on Sep. 24, 2007.

(51) Int. Cl.
*G06F 11/00* (2006.01)
(52) U.S. Cl. ........................................ 714/792
(58) Field of Classification Search ........... 714/793
See application file for complete search history.

(56) References Cited

U.S. PATENT DOCUMENTS

| | | | |
|---|---|---|---|
| 7,246,297 B2 | 7/2007 | Zarrinkhat et al. | |
| 2005/0229087 A1 | 10/2005 | Kim et al. | |
| 2006/0190797 A1* | 8/2006 | Xin | 714/758 |
| 2008/0052594 A1* | 2/2008 | Yedidia et al. | 714/758 |
| 2008/0086670 A1* | 4/2008 | Krouk et al. | 714/752 |
| 2009/0041145 A1* | 2/2009 | Chockalingam et al. | 375/261 |
| 2009/0217128 A1* | 8/2009 | Xin | 714/752 |
| 2011/0078548 A1* | 3/2011 | Xin | 714/807 |

OTHER PUBLICATIONS

Ardakani et al., Gear-Shift Decoding; IEEE Trans. Communications., vol. 54, No. 7; Jul. 2006; pp. 1235-1242.
R. G. Gallager, Low Density Parity-Check Codes; MIT Press Cambriidge, MA1963; 90 pages.
Zarrinkhat et al., Hybrid Decoding of Irregular LDPC Codes; Proc. IEEE Int. Symp. Inform. Theory (ISIT), Adalaide, Australia, Sep. 2005; pp. 312-316.
Zarrinkhat et al., Threshold Values and Convergence Properties of Majority-Based Algorithms for Decoding Regular Low-Density Parity-Check Codes; IEEE Trans. Commun.; vol. 52. No. 12, Dec. 2004; pp. 2087-2097.
Zarrinkhat et al., Haybrid Hard-Decision Iterative Decoding of Irregular Low-Density Parity-Check Codes; IEEE Transactions on Communications, vol. 55 No. 2, Feb. 2007; pp. 292-302.
Chen, ET, Reduced-Complexity Decoding of LDPC Codes, IEEE Transactions on Communications, Aug. 2005, vol. 53, No. 8, pp. 1288-1299.

* cited by examiner

*Primary Examiner* — Bryce Bonzo
(74) *Attorney, Agent, or Firm* — James Bitetto; Joseph Kolodka

(57) ABSTRACT

A decoder and method for iteratively decoding of low-density parity check codes (LDPC) includes, in a code graph, performing check node decoding by determining messages from check nodes to variable nodes. In the code graph, variable node decoding is performed by determining messages from the variable nodes to the check nodes. The variable node decoding is independent from degree information regarding the variable nodes. Decoded results are output.

19 Claims, 4 Drawing Sheets

EFFICIENT LOW COMPLEXITY HIGH THROUGHPUT LDPC DECODING METHOD AND OPTIMIZATION

RELATED APPLICATION INFORMATION

This application claims priority to provisional application Ser. No. 60/974,512 filed on Sep. 24, 2007, incorporated herein by reference.

BACKGROUND

1. Technical Field

The present invention relates to decoding systems and methods and more particularly to low-density parity-check codes which employ less information but provide improved performance.

2. Description of the Related Art

With capacity approaching decoding performance, low-density parity-check codes (LDPC) have drawn significant interest in many industries for the transmission of digital information, including cellular systems, digital recording systems, etc. While turbo codes have been adopted in 3G cellular standards, LDPC codes have been included in the IEEE 802.16 standard and also considered for potential application beyond 3G cellular standards, e.g., in 4G systems. Beside cellular systems, LDPC is also considered in digital video broadcasting (DVB) systems.

When applied to different systems, the requirements for decoding complexity and decoding throughput for LDPC codes are different. Soft decoding provides capacity approaching performance but has related high decoding complexity. The binary message-passing decoding (or Hard decoding), although it incurs some performance loss, has very low-complexity and high decoding throughput. Existing binary decoding algorithms include a majority decoding algorithm (i.e., time-invariant decoding, e.g., Majority Based (MB) decoding), and switch type decoding (e.g., Gallager decoding algorithm B (GB)) (time-variant decoding). These existing binary decoding methods require the degree information of variable nodes. To make the degree information available to the decoder, much additional complexity is introduced on a circuit implementation of the LDPC decoder.

Therefore, a need exists for a new binary message-passing LDPC coding that does not need degree information and provides the same or better performance than existing systems.

SUMMARY

A decoder and method for iteratively decoding of low-density parity check codes (LDPC) includes, in a code graph, performing check node decoding by determining messages from check nodes to variable nodes. In the code graph, variable node decoding is performed by determining messages from the variable nodes to the check nodes. The variable node decoding is independent from degree information regarding the variable nodes. Decoded results are output.

A decoder for low-density parity check codes (LDPC) includes a check node decoder configured to determine messages from check nodes to variable nodes in a code graph, and a variable node decoder configured to determine messages from the variable nodes to the check nodes. The variable node decoder decodes variable nodes independently from degree information of the variable nodes.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
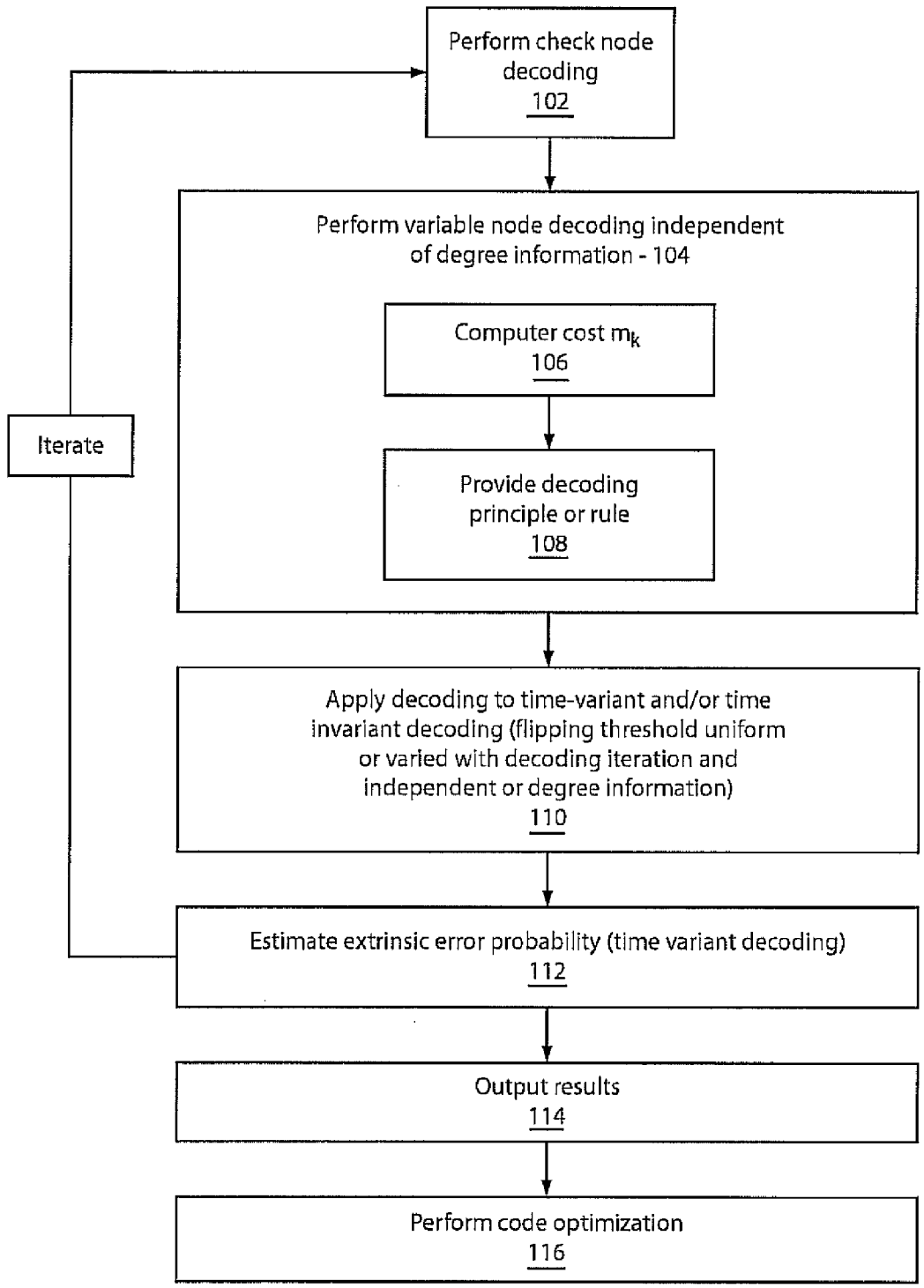
FIG. 1 is a block/flow diagram showing an illustrative iterative decoding system/method in accordance with the present principles.

In accordance with the present principles, a new binary message-passing low-density parity-check code (LDPC) coding method with low-complexity and high decoding throughput is provided, which facilitates a circuit implementation of a decoder. With existing binary message-passing decoding methods, the complexity of circuit implementation is much higher than expected due to degree information required for the decoder. The present embodiments provide a novel decoding principle, which does not need degree information. Therefore, both computational complexity and circuit implementation complexity are very low.

With new decoding methods applied to both time-invariant and time variant decoding methods, optimized irregular LDPC codes perform exactly the same or better than the code from existing decoding methods. This means the present decoding methods do not lose anything compared with the existing methods, and yet gain based on low-complexity for the circuit implementation. In addition, an estimation method is provided to estimate an extrinsic error probability for time-variant decoding. This issue has been overlooked in the prior art.

Binary message-passing decoding, i.e., hard decoding is provided that has extremely low-complexity, which is achieved with little performance loss as compared with soft decoding. This makes the decoding methods in accordance with the present principles more attractive to many systems that demand high decoding throughputs.

A novel message-passing decoding method for low-density parity-check codes with low-complexity and high decoding throughput does not need the degree information of the variable nodes and can be applied to both time-invariant and time-variant decoding methods. For time-variant decoding, a method is presented to estimate the extrinsic error probability. EXIT chart analysis and code optimization for new decoding method in both time-invariant and time-variant decoding scenarios were performed. For time-invariant decoding, the optimized codes exhibit a high error floor in a high SNR region. A code design method achieves low error floor by introducing additional constraints. For time-variant decoding, we show that the code optimization can be simplified with only several switching points in the constraints. The analysis and numerical results show that the present methods provide the same performance as the existing methods for both time-invariant and time-variant decoding while the new method achieves much lower complexity for circuit implementations.

Embodiments described herein may be entirely hardware, entirely software or including both hardware and software elements. In a preferred embodiment, the present invention is implemented in hardware but may include software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

Due to relative large block-length usually considered for LDPC codes, maximum likelihood (ML) decoding methods, e.g., syndrome decoding, cannot be applied for decoding LDPC codes. Therefore, suboptimal decoding methods, i.e., iterative message-passing decoding methods, are considered as the applicable decoding methods. Based on bipartite or Tanner graph representations of LDPC codes, the iterative message-passing method performs the repetition decoding at variable nodes and single parity-check (SPC) decoding at check nodes iteratively. The extrinsic messages from the decoding at the variable nodes and check nodes are exchanged along edges in a code graph.

There are three categories of message-passing decoding methods, namely, soft decoding, hard decoding, and mixed decoding methods. With soft decoding methods, the decoder performs the iterative decoding by exchanging the soft extrinsic information between the variable nodes and check nodes. Such decoding methods, for example, sum-product decoding, provide better error correction performance but have high decoding complexity. Hard decoding, e.g., majority decoding, exchanges the binary extrinsic message in the decoder. Such decoding methods have some performance loss compared with soft decoding methods, but are attractive for high throughput performance and low-complexity.

Mixed decoding, e.g., gear-shift decoding, reduces the computational complexity of soft decoding without incurring the performance loss by dynamically switching the soft decoding and the binary decoding during the decoding iterations. Although the computational complexity is reduced, the implementation complexity in the circuit level is increased due to complex control units for the decoding switches and more decoding processing units for several types of decoders.

Referring now to the drawings in which like numerals represent the same or similar elements and initially to FIG. 1, a new binary message-passing decoding principle is described, which focuses on binary message-passing hard decoding for LDPC codes.

We consider an irregular LDPC code with N variable nodes and M check nodes. We treat the $(d_v, d_c)$ regular LDPC codes as the special cases of irregular codes. Assume that the channel is binary symmetric channel (BSC) and the output is mapped to $\{+1, -1\}$. Denote $u_{c \to v,j}$, $v_{v \to c,j}$, and $u_n$ as the extrinsic message outputs from a check node to a variable node, an extrinsic message output from a variable node passed along the jth edge to a check node, and a channel message from the nth variable node, respectively. Define $v_n$ as a set of edges that are connected to the nth variable node, and $U_m$ as a set of edges that are connected to the mth check node. Note that any channel can be treated as BSC since we can always perform a hard decision from the channel output or the equalizer output before performing the LDPC decoding.

For regular codes, we have the cardinalities of $v_n$ and $U_m$ given by $|v_n|=d_v$, n=1, ..., N and $|U_m|=d_c$, m=1, ..., M, respectively.

The decoding output from the lth iteration (denoted by script l in the equations) is given by:

In block 102, check node decoding is performed in accordance with the following equation:

$$u_{c \to v,k}^{(l)} = \prod_{j \in U_m, j \neq k} v_{v \to c,j}^{(l)}, k \in U_m, m = 1, \ldots M.$$

For all existing binary message-passing decoding methods, the decoder has to obtain the threshold values based on degree information of the variable node. Degree is the weight of a coded bit (i.e., variable node) or a parity-check constraint (i.e., check node). When the code is represented by a code graph, the degree of a node (either a variable node or a check node) is the number of edges connected to this node. The degree values of the nodes in the code graph are the degree information.

However, when implementing the decoder at the circuit level, the degree information of the variable nodes is usually not available for processing unit in the LDPC decoder, or to implement such decoding methods, the degree information for the variable nodes has to be stored in a circuit and retrieved by a processing unit. The implementation complexity of the LDPC decoder is then increased. Since the advantage of LDPC hard decoding is low-complexity, the requirement of degree information will weaken the advantages of the hard decoding.

In block 104, variable node decoding is performed without the need for degree information in accordance with the following:

In block 106, we first obtain the cost $m_k$, which is the discrepancy of extrinsic inputs:

$$m_k^{(l)} = - \sum_{j \in V_n, j \neq k} u_{c \to v,j}^{(l)} u_n, k \in V_n.$$

Then, we obtain the decoding principle or rule for variable nodes in block 108:

$$v_{v \to c,k}^{(l+1)} = \begin{cases} -u_n & \text{if } m_k^{(l)} \geq d', \\ u_n, & \text{otherwise,} \end{cases}$$

where d is a flipping threshold for the decoding of variable nodes. Majority vote may be applied to the decoding of the variable nodes. Otherwise, channel input is sent as the extrinsic output.

One variation of obtaining the cost $m_k$ is given by:

$$\text{For } j \in V_n, j \neq k: \begin{cases} m_k^{(l)}++, & \text{if } u_{c \to v,j}^{(l)} \neq u_n, \\ m_k^{(l)}--, & \text{if } u_{c \to v,j}^{(l)} = u_n. \end{cases}$$

The cost may be obtained using other methods as well.

One important property of above decoding method is that unlike the existing methods, the cost $m_k$ does not need degree information of the variable nodes, neither does the flipping threshold d. A mapping between a threshold value ($\omega$) in the existing MB decoding for bit flipping, and the flipping threshold d in the present decoding method is possible, or the flipping threshold d may be set as a function of the degrees of variable nodes. In a preferred embodiment, d is constant or uniform for all variable nodes to provide low-complexity.

Because the cost $m_k$ is the discrepancy of the extrinsic inputs, the degree information is not needed for a given d. This is applicable to time-variant (variable d) and time-invariant (fixed d) decoding methods. With this property, the complexity is significantly reduced for a circuit implementation of the decoder. For example, by reducing the number of inputs to a decoder design, which would have to be provided for each decoded channel the complexity of the decoder design, is significantly reduced.

In block 110, the present principles can be applied to irregular codes with time-invariant decoding and time-variant decoding. When applied to irregular codes, the flipping threshold d is applied uniformly for all variable nodes. In time-invariant decoding, d does not change during the decoding. In time-variant, we change $d^{(l)}$ uniformly at the lth decoding iteration.

In block 112, estimation of extrinsic error probability for decoding is performed. Denote $P_c^{(l)}$ as the probability of unsatisfied check nodes at the lth decoding iteration. The estimated extrinsic error probability for the LDPC codes with regular profiles for the check nodes is given by $$\hat{p}^{(l)} = \frac{1}{2}\left(1 - (1 - 2\hat{P}_c^{(l)})^{\frac{1}{d_c}}\right).$$

For the codes with irregular check nodes, the estimations of extrinsic error probability with first order and second order approximations are given respectively, by:

$$\hat{p}^{(l)} \approx \frac{\hat{P}_c^{(l)}}{\sum_j \tilde{\rho}_j j},$$

$$\hat{p}^{(l)} \approx \frac{\sum_j \tilde{\rho}_j j - \sqrt{\left(\sum_j \tilde{\rho}_j j\right)^2 - 4\hat{P}_c^{(l)} \sum_j \tilde{\rho}_j j(j-1)}}{2\sum_j \tilde{\rho}_j j(j-1)}$$

$$= \frac{1}{2}\frac{\sum_j \tilde{\rho}_j j}{\sum_j \tilde{\rho}_j j(j-1)}\left[1 - \sqrt{1 - 4\hat{P}_c^{(l)}\frac{\sum_j \tilde{\rho}_j j(j-1)}{\left(\sum_j \tilde{\rho}_j j\right)^2}}\right]$$

$$\approx a\hat{P}_c^{(l)}\left[1 + \hat{P}_c^{(l)}b + 2(\hat{P}_c^{(l)})^2 b^2\right],$$

where $$a = \frac{1}{\sum_j \tilde{\rho}_j j}, \quad b = \frac{\sum_j \tilde{\rho}_j j(j-1)}{\left(\sum_j \tilde{\rho}_j j\right)^2}.$$

The estimation with the second order performs well in the time-variant decoding.

Blocks 102-112 are part of an iterative decoding method and are performed, as needed, in an iterative process. Therefore, the decoder iteratively performs check decoding and variable node decoding. The iterative decoding stops if the maximum number of iterations is reached, or all parity checks are satisfied.

In block 116, code optimization may optionally be performed. The code optimization is not a part of the decoder. The code optimization finds a best code profile (of a group of codes, so called code ensemble) with the best performance given a certain decoding method.

The ensemble of irregular LDPC codes can be specified by two polynomials $$\lambda(x) = \sum_{j=1}^{D_L} \lambda_j x^{j-1} \text{ and } \rho(x) = \sum_{j=1}^{D_R} \rho_j x^{j-1},$$

where $\lambda_j$ is the fraction of edges in the bipartite graph that are connected to variable nodes of degree j, $\rho_j$ is the fraction of edges that are connected to check nodes of degree j, $D_L$ and $D_R$ denote the maximal degree of variable nodes and check nodes, respectively. Equivalently, the degree profiles can also be specified from the node perspective, i.e., two polynomials of the same form where $\lambda_j$ is the fraction of variable nodes of degree j, and $\rho_j$ is the fraction of check nodes of degree j.

Time-invariant decoding: For time-invariant decoding, we simply apply the same threshold value d for all the variable nodes with different degree. For time-variant decoding we change $d^{(l)}$ similar to $b_j^{(l)}$. Again, we apply the same $d^{(l)}$ to all variable nodes in the nth iteration. Denote $p_0$ as the initial error probability from the channel.

The irregular code optimization for time-invariant decoding with the present decoding principle is summarized as follows:

$$\max_{\{\lambda_j, \rho_j, d, D_{min}\}} \quad p_0$$

$$\text{s.t.} \sum_{j=D_{min}}^{D_L} \lambda_j h_{j,\lfloor(j+d)/3\rfloor}^{p_0}(x) < x, \forall x; 1 \leq d \leq (D_{min} - 1);$$

$$\text{and } R = 1 - \frac{\sum_j \rho_j/j}{\sum_j \lambda_j/j}.$$

where $D_{min}$ denotes the minimal degree of variable nodes and check nodes and $h^{p_0}$ is the output extrinsic error probability for degree-j variable nodes after one decoding iteration with extrinsic probability x with the flipping threshold (j+d)/2.

As shown in Table 1, the performance of the optimized codes for new decoding method is exactly the same as that for hybrid MB decoding, even though compared with code design for existing hybrid MB methods in time-invariant decoding, additional constraints are needed to be introduced in the above optimization.

We find that the thresholds of designed codes for both decoding methods are exactly the same for all the code rates, indicating there is no performance loss. The components of hybrid MB decoding in optimized codes are given in the fourth column in Table 1. The optimized d*, $D_{min}$ for new decoding method are given in the fifth column of Table 1. It is seen that all the optimized components for hybrid MB decoding can be mapped to the new decoding, which means that all the optimized code profiles for hybrid MB decoding can be implemented with new decoding method. This explains why the performance of optimized codes is exactly the same for both decoding methods.

To achieve a low-error floor, a modified code optimization is provided and summarized as follows $$\sum_{j=d_{l_{min}}}^{d_{l_{max}}} \lambda_j h_{j,\lfloor(j+d)/2\rfloor}^{p_0}(x) < x, \forall x; 1 \le d \le (d_{l_{min}} - 3).$$

where $d_{1_{min}}$ and $d_{1_{max}}$ are the maximum and minimum flipping thresholds at the lth iteration.

TABLE 1

Decoding thresholds and degree components of optimized LDPC codes for time-invariant decoding.

| Code Rate | Hybrid MB Decoding $p_0^*$ | New Decoding $p_0^*$ | Hybrid MB Decoding $\{MB_j^w\}$ | New Decoding d*, $D_{min}$ |
|---|---|---|---|---|
| R = 0.1, | 0.16093 | 0.16003 | $\{MB_3^0, MB_{30}^1\}$ | 2, 3 |
| R = 0.2, | 0.12308 | 0.12308 | $\{MB_3^0, MB_{30}^1\}$ | 2, 3 |
| R = 0.3, | 0.09011 | 0.09011 | $\{MB_3^0, MB_4^1\}$ | 2, 3 |
| R = 0.4, | 0.06938 | 0.00938 | $\{MB_3^0, MB_4^1, MB_0^1\}$ | 2, 3 |
| R = 0.5, | 0.05265 | 0.05265 | $\{MB_4^1, MB_7^1, MB_{29}^1\}$ | 3, 4 |
| R = 0.6, | 0.03758 | 0.03758 | $\{MB_3^0, MB_4^1, MB_0^1\}$ | 2, 3 |
| R = 0.7, | 0.02349 | 0.02349 | $\{MB_4^1, MB_5^1\}$ | 3, 4 |
| R = 0.8, | 0.01407 | 0.01407 | $\{MB_5^1, MB_7^1, MB_8^2\}$ | 4, 5 |
| R = 0.9, | 0.00564 | 0.00564 | $\{MB_5^1, MB_8^2, MB_{16}^2\}$ | 4, 5 |

Time-variant decoding: For time-variant decoding, new decoding method with optimal switching is exactly the same as optimal GB decoding. The irregular code optimization for time-variant decoding with the new decoding principle can be simplified as follows:

$$\max_{\{\lambda_j, \rho_j\}} p_0, \text{ s.t. } h^{p_0}(v_d^{p_0}) < v_d^{p_0}, \forall v_d < p_0.|$$

The decoding of irregular code for time-variant decoding with optimal switching points is the same as that of GB decoding. Therefore, the optimized codes also perform the same as the GB decoding.

In block 114, the decoder(s) output the decoded results. Performance results comparisons for the decoders in accordance with the present principles versus the conventional decoding scheme of MB are described hereinafter.

As a point of comparison, MB decoding (time-invariant decoding) is summarized as follows:

Initialization $u_{c \to v,k}^{(0)} = $ null, $\forall k$; $v_{c \to c,k}^{(0)} = u_n$. $k \in V_n$ Check node decoding: $u_{c \to v,k}^{(\ell)} = \prod_{j \in U_m, j \ne k} v_{v \to c,j}^{(\ell)}, k \in U_m, m = 1, \ldots M.$ Variable node decoding $v_{v \to c,k}^{(\ell+1)} =$ $$\begin{cases} -u_n, & \text{if } |\{j : u_{c \to v,j}^{(\ell)} = -u_n, j \in V_n, j \ne k\}| \ge \lceil |V_n|/2 \rceil + \omega \\ u_n, & \text{otherwise.} \end{cases}$$

The GB decoding (time-variant decoding) method is summarized as follows: The variable node decoding is given by;

$$u_{v \to c,k}^{(\ell+1)} = \begin{cases} -u_n & \text{if } |\{j : u_{c \to v,j}^{(\ell)} = -u_n, j \in V_n, j \ne k\}| \ge b_n^{(\ell+1)} \\ u_n, & \text{otherwise,} \end{cases}$$

where $b_n^{(l)}$, $\lceil |V_n|/2 \rceil \le b_n^{(l)} \le |V_n|-1,|$ denotes the flip threshold in decoding the nth variable node at the lth decoding iteration.

Both existing methods for variable decoding require the degree information of the variable nodes, which increases the complexity of the circuit implementation.

Performance results: The optimized codes for decoding methods in accordance with the present principles in time-invariant decoding have exactly the same performance as the existing hybrid MB decoding.

TABLE 2

Number of component EXIT functions for code optimization with time-invariant decoding.

| | Hybrid MB Decoding | |
|---|---|---|
| Number of component EXIT functions | $\sum_{j=D_{min}}^{D_L} j - \lceil j/2 \rceil$ | New Decoding $D_L - D_{min}$ |
| $D_L = 30, D_{min} = 3$ | 224 | 28 |
| $D_L = 50, D_{min} = 3$ | 624 | 48 |

Advantageously, the number of EXIT functions is significantly reduced in accordance with the present principles.

Figure 2:
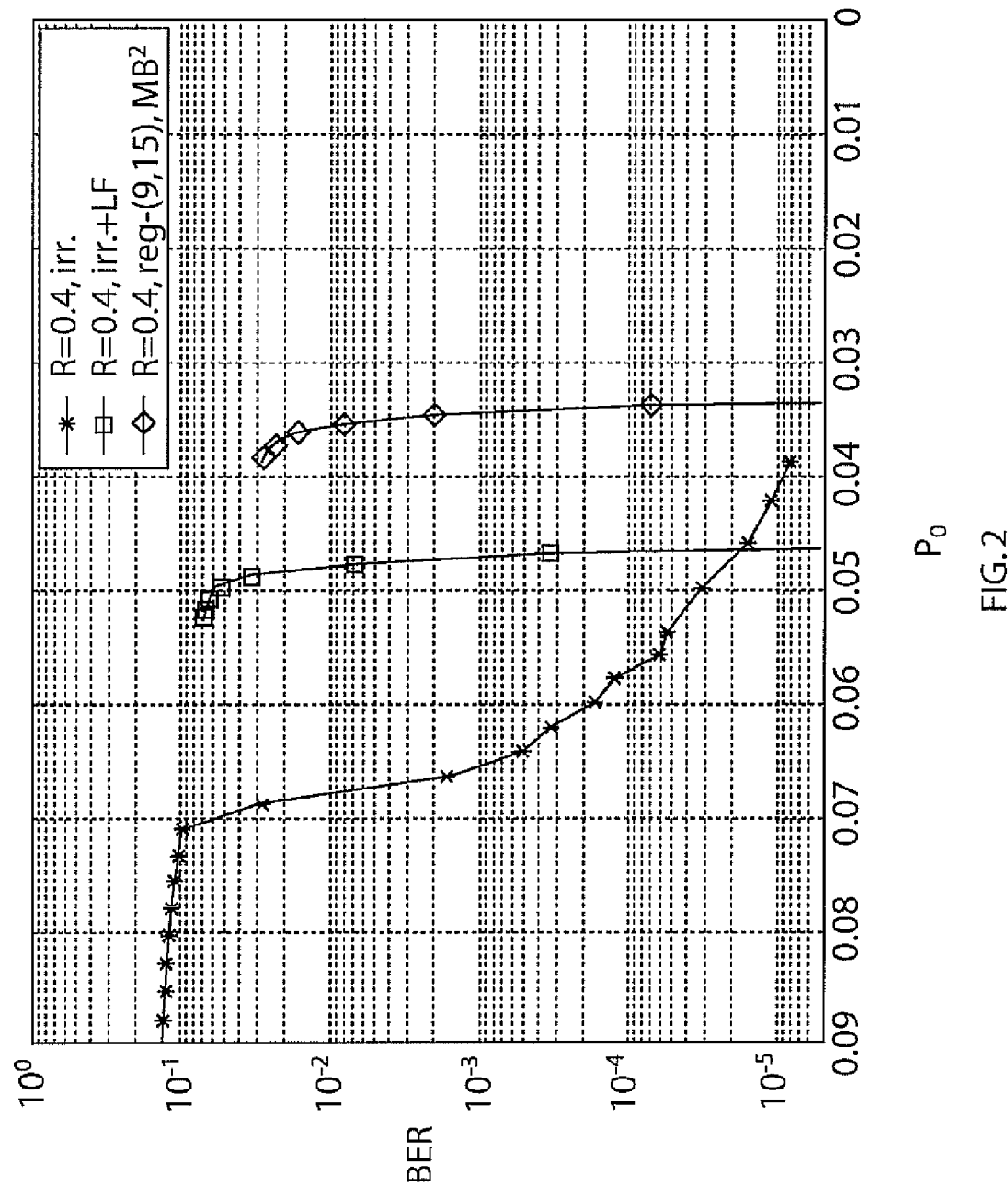
FIG. 2 is a semi-log graph of bit error rate (BER) performance versus probability ($P_0$) for time-invariant decoding for irregular (irr.) LDPC codes with low error-floor (LF), regular (9.15) MB code is shown for comparison in accordance with the present principles.

FIG. 2 is a semi-log graph of bit error rate (BER) performance versus probability ($P_0$) for time-invariant decoding for irregular (irr.) LDPC codes with low error-floor (LF), regular (9.15) MB code is shown for comparison. R is the code rate. Here in FIG. 2, the code rate R=0.4.

Figure 3:
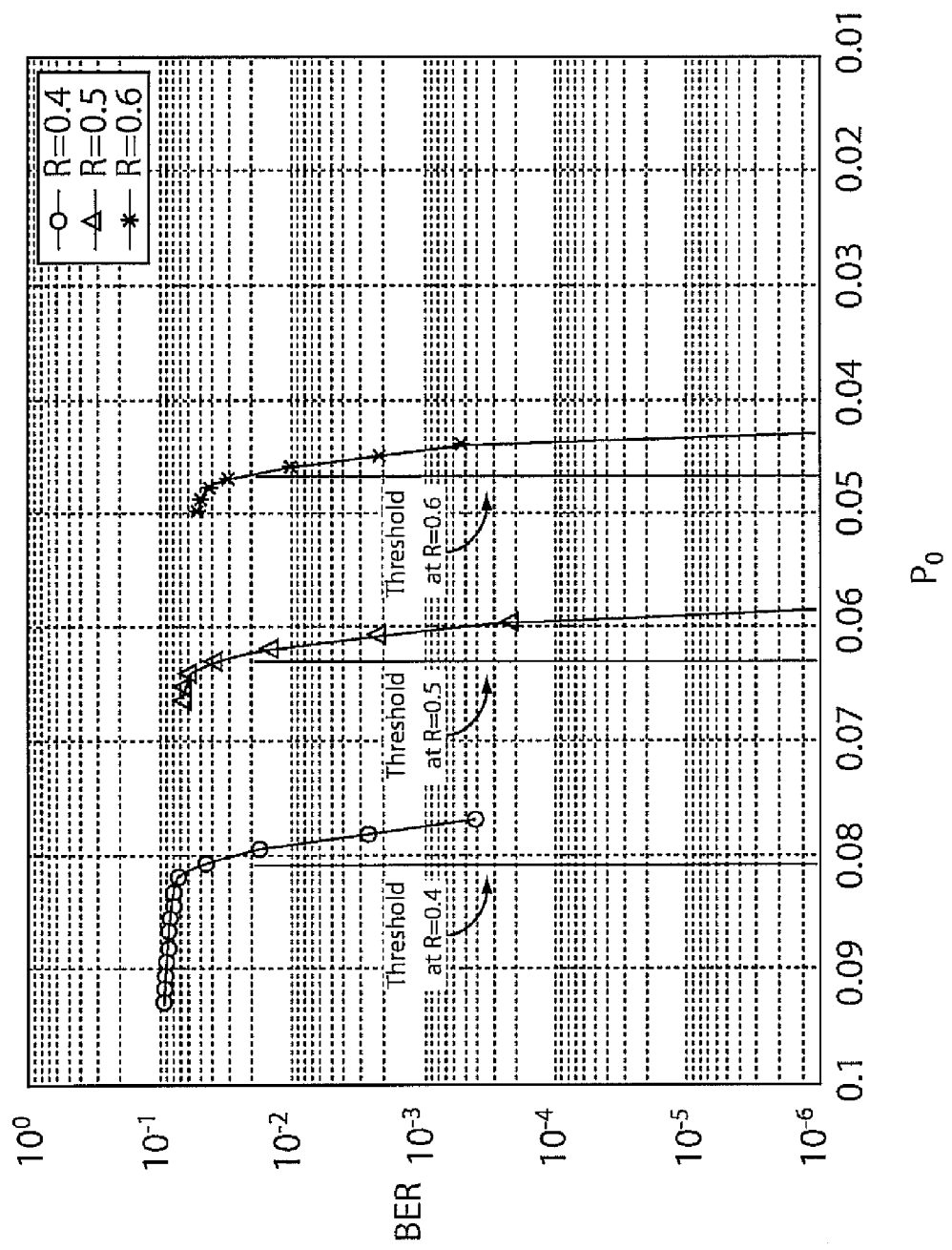
FIG. 3 is a semi-log graph of bit error rate (BER) performance versus probability (Pa) for time-variant decoding for optimized irregular (irr.) LDPC codes with varying code rates (R=0.4, 0.5, and 0.6) in accordance with the present principles.

FIG. 3 is a semi-log graph of bit error rate (BER) performance versus probability ($P_0$) for time-variant decoding for optimized irregular (irr.) LDPC codes with varying code rate R (R=0.4, 0.5, and 0.6) in accordance with the present principles.

Figure 4:
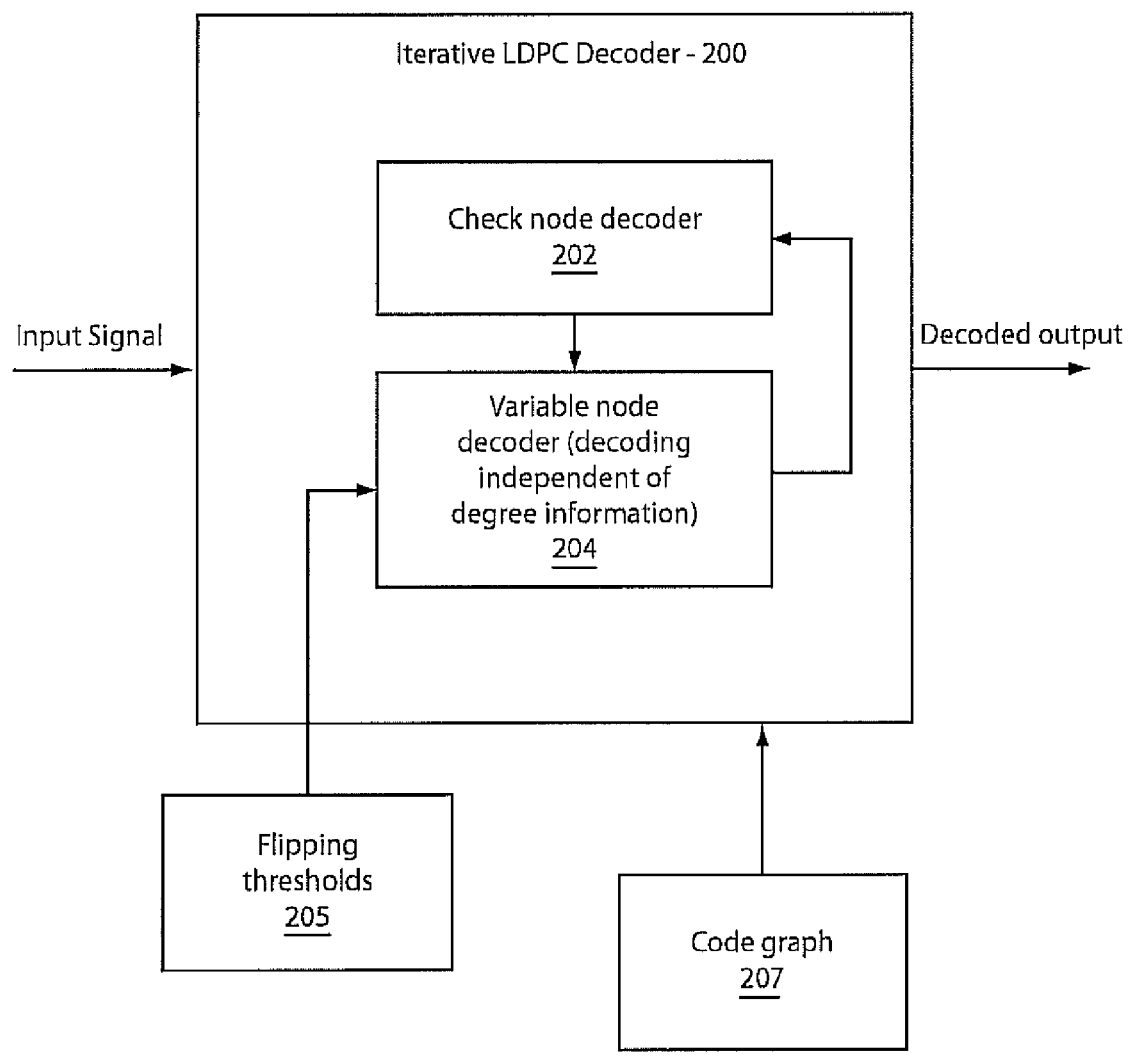
FIG. 4 is a block diagram showing a LDPC decoder in accordance with one illustrative embodiment.

Referring to FIG. 4, an iterative decoder 200 for low-density parity check codes (LDPC) is preferably implemented in a hardware circuit. The hardware circuit may include software elements and may be formed on a printed wiring board, integrated circuit chip or embodied in any other type of hardware. Decoder 200 includes a check node decoder 202 configured to determine messages from check nodes to variable nodes in a code graph 207. A variable node decoder 204 is configured to determine messages from the variable nodes to the check nodes wherein the variable node decoder decodes variable nodes independent from degree information of the variable nodes.

The variable node decoder 204 includes flipping thresholds 205 which are not based upon degree information of the variable nodes as described above with respect to FIG. 1. The variable node decoder finds a cost $m_k$ which is determined from a discrepancy between extrinsic inputs of variable nodes. The cost $m_k$ may be computed as $$m_k^{(l)} = -\sum_{j \in V_n, j \neq k} u_{c \to v, j}^{(l)} u_n, k \in V_n.$$

where $u_{c \to v,j}$ is the extrinsic message outputs from a check node along a jth edge to a variable node, $v_{v''c,j}$ is an extrinsic message output from a variable node passed along a jth edge to a check node, $u_n$ is a channel message from the nth variable node, $v_n$ is a set of edges that are connected to the nth variable node, and k is an index of the edges in the code graph. In the equation, for the particular node n, k is the index of the edges that are connected to node n, i.e., $k \in v_n$.

The variable node decoder includes a decoding principle for variable nodes, e.g., $$v_{v \to c,k}^{(l+1)} = \begin{cases} -u_n & \text{if } m_k^{(l)} \geq d, \\ u_n, & \text{otherwise,} \end{cases}$$

where $v_{v \to c,j}$, is an extrinsic message output from a variable node passed along a kth edge to a check node, $u_n$ is a channel message from the nth variable node, and d is a flipping threshold for the decoding of variable nodes. Other decoding principles or rules may also be employed.

Having described preferred embodiments of a system and method for efficient low complexity high throughput LPDC decoding and optimization (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for iterative decoding of low-density parity check codes (LDPC), comprising:
in a code graph, performing check node decoding by determining messages from check nodes to variable nodes;
in the code graph, stored using a computer readable storage medium, performing variable node decoding by determining messages from the variable nodes to the check nodes wherein the variable node decoding is independent from degree information regarding the variable nodes; and
outputting decoded results.

2. The method as recited in claim 1, wherein performing variable node decoding includes obtaining flipping threshold values for determining the results which are not based upon degree information of the variable nodes.

3. The method as recited in claim 1, wherein performing variable node decoding includes obtaining a cost $m_k$, which is a discrepancy between extrinsic inputs of variable nodes.

4. The method as recited in claim 3, wherein the cost $m_k$ is determined as $$m_k^{(l)} = -\sum_{j \in V_n, j \neq k} u_{c \to v,j}^{(l)} u_n, k \in V_n,$$

where $u_{c \to v,j}$ is the extrinsic message outputs from a check node along a jth edge to a variable node, $v_{v \to c,j}$, is an extrinsic message output from a variable node passed along a jth edge to a check node, $u_n$ is a channel message from the nth variable node, $v_n$ is a set of edges that are connected to the nth variable node, and k is an index of edges in a code graph.

5. The method as recited in claim 1, wherein performing variable node decoding includes providing a decoding principle for variable nodes.

6. The method as recited in claim 5, wherein providing a decoding principle for variable nodes includes $$u_{v \to c,k}^{(l+1)} = \begin{cases} -u_n & \text{if } m_k^{(l)} \geq d, \\ u_n, & \text{otherwise,} \end{cases}$$

where $v_{v \to c,j}$, is an extrinsic message output from a variable node passed along a kth edge to a check node, $u_n$ is a channel message from the nth variable node, and d is a flipping threshold for the decoding of variable nodes.

7. The method as recited in claim 6, wherein the flipping threshold is independent of degree information for variable nodes.

8. The method as recited in claim 6, wherein the flipping threshold is constant for time-invariant decoding methods.

9. The method as recited in claim 6, wherein the flipping threshold is varied in accordance with decoding iteration for time-variant decoding methods.

10. A decoder, utilizing a computer readable storage medium, for low-density parity check codes (LDPC), comprising:
a check node decoder configured to determine messages from check nodes to variable nodes in a code graph; and
a variable node decoder configured to determine messages from the variable nodes to the check nodes wherein the variable node decoder decodes variable nodes independently from degree information of the variable nodes.

11. The decoder as recited in claim 10, wherein the variable node decoder includes flipping thresholds which are not based upon degree information of the variable nodes.

12. The decoder as recited in claim 10, wherein the variable node decoder includes a cost $m_k$ which is determined from a discrepancy between extrinsic inputs of variable nodes.

13. The decoder as recited in claim 12, wherein the cost $m_k$ is computed as $$m_k^{(l)} = -\sum_{j \in V_n, j \neq k} u_{c \to v,j}^{(l)} u_n, k \in V_n,$$

where $u_{c \to v,j}$ is the extrinsic message outputs from a check node along a jth edge to a variable node, $v_{v \to c,j}$, is an extrinsic message output from a variable node passed along a jth edge to a check node, $u_n$ is a channel message from the nth variable node, $v_n$ is a set of edges that are connected to the nth variable node, and k is an index of the edge in the code graph.

14. The decoder as recited in claim 10, wherein the variable node decoder includes a decoding principle for variable nodes.

15. The decoder as recited in claim 14, wherein the decoding principle for variable nodes includes $$u_{v \to c,k}^{(\ell+1)} = \begin{cases} -u_n & \text{if } m_k^{(\ell)} \geq d, \\ u_n, & \text{otherwise,} \end{cases}$$

where $v_{v \to c,j}$, is an extrinsic message output from a variable node passed along a kth edge to a check node, $u_n$ is a channel message from the nth variable node, and d is a flipping threshold for the decoding of variable nodes.

16. The decoder as recited in claim 15, wherein the flipping threshold is independent of degree information for variable nodes.

17. The decoder as recited in claim 15, wherein the flipping threshold is constant for time-invariant decoding methods.

18. The decoder as recited in claim 15, wherein the flipping threshold is varied in accordance with decoding iteration for time-variant decoding methods.

19. The decoder as recited in claim 10, wherein the decoder is implemented in a hardware circuit.

* * * * *